(12) United States Patent
Ni

(10) Patent No.: US 7,876,177 B2
(45) Date of Patent: Jan. 25, 2011

(54) RESONATOR HAVING AN OUTPUT ELECTRODE UNDERNEATH FIRST AND SECOND ELECTRODE ARMS

(75) Inventor: Wei Ni, Tokyo (JP)

(73) Assignee: Oki Semiconductor Co., Ltd., Tokyo (JP)

(*) Notice: Subject to any disclaimer, the term of this patent is extended or adjusted under 35 U.S.C. 154(b) by 193 days.

(21) Appl. No.: 12/344,349

(22) Filed: Dec. 26, 2008

(65) Prior Publication Data

US 2009/0184781 A1 Jul. 23, 2009

(30) Foreign Application Priority Data

Jan. 18, 2008 (JP) ............................. 2008-008972

(51) Int. Cl.
*H03H 9/125* (2006.01)
*H03H 9/24* (2006.01)

(52) U.S. Cl. .................. 333/186; 333/200; 310/309

(58) Field of Classification Search .............. 333/186, 333/197, 200; 310/309
See application file for complete search history.

(56) References Cited

U.S. PATENT DOCUMENTS

| | | | | |
|---|---|---|---|---|
| 5,892,153 | A * | 4/1999 | Weinberg et al. | 73/504.16 |
| 6,127,767 | A * | 10/2000 | Lee et al. | 310/309 |
| 6,359,757 | B1 * | 3/2002 | Mallary | 360/294.3 |
| 6,549,099 | B2 * | 4/2003 | Taussig | 333/186 |
| 6,831,531 | B1 * | 12/2004 | Giousouf et al. | 333/200 |
| 7,231,824 | B2 * | 6/2007 | French et al. | 73/504.12 |
| 7,279,761 | B2 * | 10/2007 | Acar et al. | 257/415 |
| 7,355,318 | B2 * | 4/2008 | Dean et al. | 310/309 |
| 7,426,861 | B2 * | 9/2008 | Weinberg et al. | 73/504.16 |
| 2009/0189481 | A1 * | 7/2009 | Kaajakari | 310/309 |

FOREIGN PATENT DOCUMENTS

| | | |
|---|---|---|
| JP | 06013836 | 1/1994 |
| JP | 2005-224934 | 8/2005 |
| JP | 2005-229564 | 8/2005 |
| JP | 2005-258081 | 9/2005 |
| JP | 2005-323271 | 11/2005 |
| JP | 2006-128912 | 5/2006 |
| JP | 2006-210265 | 8/2006 |

OTHER PUBLICATIONS

English language machine translation of JP 2005-229564 published Aug. 25, 2005.*
F.D. Bannon et al., "High-Q HF Microelectromechanical Filters" IEEE Journal of Solid-State Circuits, vol. 35, No. 4, Apr. 2000, pp. 512-526.
Office Action From Japanese Patent Office Dated Jan. 26, 2010 With English Translation.

* cited by examiner

*Primary Examiner*—Barbara Summons
(74) *Attorney, Agent, or Firm*—Volentine & Whitt, P.L.L.C.

(57) ABSTRACT

A resonator that can alleviate restrictions in usage and design due to the bias voltage dependency and for which usage and design conditions can be easily determined, includes a movable electrode opposite and sandwiching the fixed electrode, and an extension of the fixed electrode or the movable electrode that extends along a plane crossing the opposite surfaces of the fixed electrode and the movable electrode. With being displaced vertically relative to the fixed electrode, the movable electrode is vibrated.

3 Claims, 13 Drawing Sheets

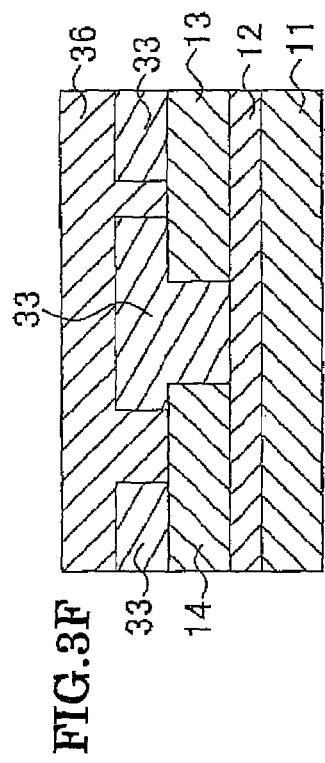
FIG.3A
FIG.3B
FIG.3C
FIG.3D
FIG.3E
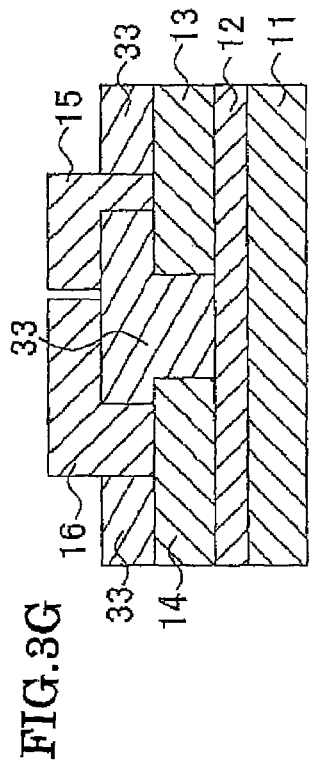
FIG.3F
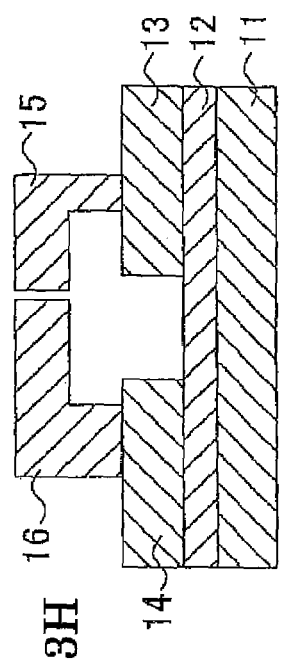
FIG.3G
FIG.3H

RESONATOR HAVING AN OUTPUT ELECTRODE UNDERNEATH FIRST AND SECOND ELECTRODE ARMS

BACKGROUND OF THE INVENTION

1. Field of the Invention

The present invention relates to a resonator for outputting a resonant frequency signal.

2. Description of the Related Art

In recent years, MEMSs (Micro Electro Mechanical Systems), which are extremely small devices where an electromechanical mechanism is formed on a substrate made of, e.g., Si by using ultrafine processing to have mechanical and electrical functions, have been attracting attention as enabling the realization of functions that have not been realized. An electromechanical mechanism formed on a substrate includes a mechanical element, a sensor, an actuator, and an electronic circuit, etc., integrated on a substrate.

Actuators used in MEMSs include ones using an electrostatic force, ones using an electromagnetic force, ones using a piezoelectric effect, ones using thermal distortion, etc. In particular, actuators using an electrostatic force as driving means are most often used which are simple in structure and easy to miniaturize. Moreover, a parallel plate-type electrostatic actuator, a comb-teeth-shaped electrostatic actuator, an electrostatic motor, or the like is used as an actuator using an electrostatic force as driving means.

Commercially available products actually using an MEMS include inkjet printers, pressure sensors, acceleration sensors, gyroscopes, DMDs (projectors), etc. It is possible to produce resonators by the MEMS technology, and because the resonators are small-sized and can realize a high Q value, they can be used instead of crystal filters and crystal oscillators.

For the above resonators, the bias voltage applied between their input and output and the resonant frequency are important, and for parallel plate-type resonators, the following equation 1, a relational expression, is satisfied. Refer to Equation 12 in F. T. Bannon, J. R. Clark, C. T.-C. Neuyen, "High-Q HF Microelectromechanical Filters" proceedings, IEEE JOURNAL OF SOLID-STATE CIRCUITS, VOL. 35M No. 4, APRIL 2000, pp. 512-526.

$$f = \frac{1}{2\pi}\sqrt{\frac{k_m - k_e}{m}} = \frac{1}{2\pi}\sqrt{\frac{k_m}{m}}\left(1 - \frac{k_e}{k_m}\right)^{\frac{1}{2}} \quad \text{(Equation 1)}$$

Here, m is the mass of the resonator, ke is the electrical spring constant of the resonator, and km is the mechanical spring constant of the resonator. Generally, the equation 2 is satisfied and hence the equation 1 can be Taylor expanded into the equation 3.

$$k_m \gg k_e \quad \text{(Equation 2)}$$

$$f = \frac{1}{2\pi}\sqrt{\frac{k_m}{m}}\left(1 - \frac{k_e}{2k_m}\right) \quad \text{(Equation 3)}$$

The electrical spring constant ke of the resonator is given by the equation 4.

$$k_e = \frac{\varepsilon A V^2}{d^3} \quad \text{(Equation 4)}$$

Substituting the equation 4 into the equation 3, the equation 5 is obtained.

$$f = \frac{1}{2\pi}\sqrt{\frac{k_m}{m}}\left(1 - \frac{\varepsilon A V^2}{2k_m d^3}\right) \quad \text{(Equation 5)}$$
$$= -\frac{\varepsilon A}{2\pi k_m d^3}\sqrt{\frac{k_m}{m}}V^2 + \frac{1}{2\pi}\sqrt{\frac{k_m}{m}}$$

Here, A is the opposite area of the opposite electrodes of the resonator, V is the bias voltage between the electrodes of the resonator, d is the distance between the electrodes of the resonator, and $\in$ is the permittivity of the dielectric material.

From the equation 5 it is seen that the resonant frequency f is proportional to $-V^2$. Further, since the value indicating the magnitude of bias voltage dependency is the coefficient of $V^2$ in the equation 5, the value is determined by the electrode opposite area A, the electrode-to-electrode distance d, the permittivity $\in$ of the dielectric material, the mass m of the resonator, and the mechanical spring constant km of the resonator.

Meanwhile, as a resonator with comb-teeth-shaped electrodes, there is known a surface acoustic wave device where an IDT for SAW resonance and a pair of distributed reflectors are formed on a crystal substrate as described in Japanese Patent Kokai No. H06-13836.

SUMMARY OF THE INVENTION

However, with the above-cited parallel plate-type resonator, as the bias voltage increases, the resonant frequency always decreases as seen from the equation 5. Hence, if the bias voltage is increased, the resonant frequency cannot be maintained or increased. Moreover, in order to suppress the decrease in the resonant frequency when increasing the bias voltage, the coefficient of $V^2$ in the equation 5 needs to be adjusted so as to adjust the magnitude of bias voltage dependency. Therefore, the bias voltage dependency imposes restrictions in usage and design.

The present invention has been made in view of the above-described situation, and an object thereof is to provide a resonator that can alleviate restrictions in usage and design due to the bias voltage dependency and for which usage and design conditions can be easily determined.

In order to achieve the above object, according to the present invention, there is provided a resonator comprising a fixed electrode having at least one arm, a movable electrode having at least two arms opposite and sandwiching the arm of the fixed electrode, and a support portion supporting the movable electrode to be vibratable in a direction parallel to the opposite surfaces of both the arms. The fixed electrode or the movable electrode has an extension extending along a plane crossing the opposite surfaces of the arms of the fixed electrode and the movable electrode.

The extension of the fixed electrode may be formed of a plurality of independent electrodes, and each of the plurality of independent electrodes may be connected to switch means.

Both the fixed electrode and the movable electrode may have the extension. Further, the extension of the movable electrode may have an extension support portion and a vibrating portion.

The resonator of the present invention comprises a fixed electrode and a movable electrode opposite and sandwiching the fixed electrode. Further, an extension extending along a plane crossing the opposite surfaces of the fixed electrode and the movable electrode is provided. By this means, restrictions in usage and design due to the bias voltage dependency can be alleviated, and usage and design conditions can be easily determined.

BRIEF DESCRIPTION OF THE DRAWINGS

FIGS. 3A to 3H are sectional views of the resonator according to the first embodiment of the present invention for respective manufacturing processes;

DETAILED DESCRIPTION OF THE INVENTION

Figure 1:
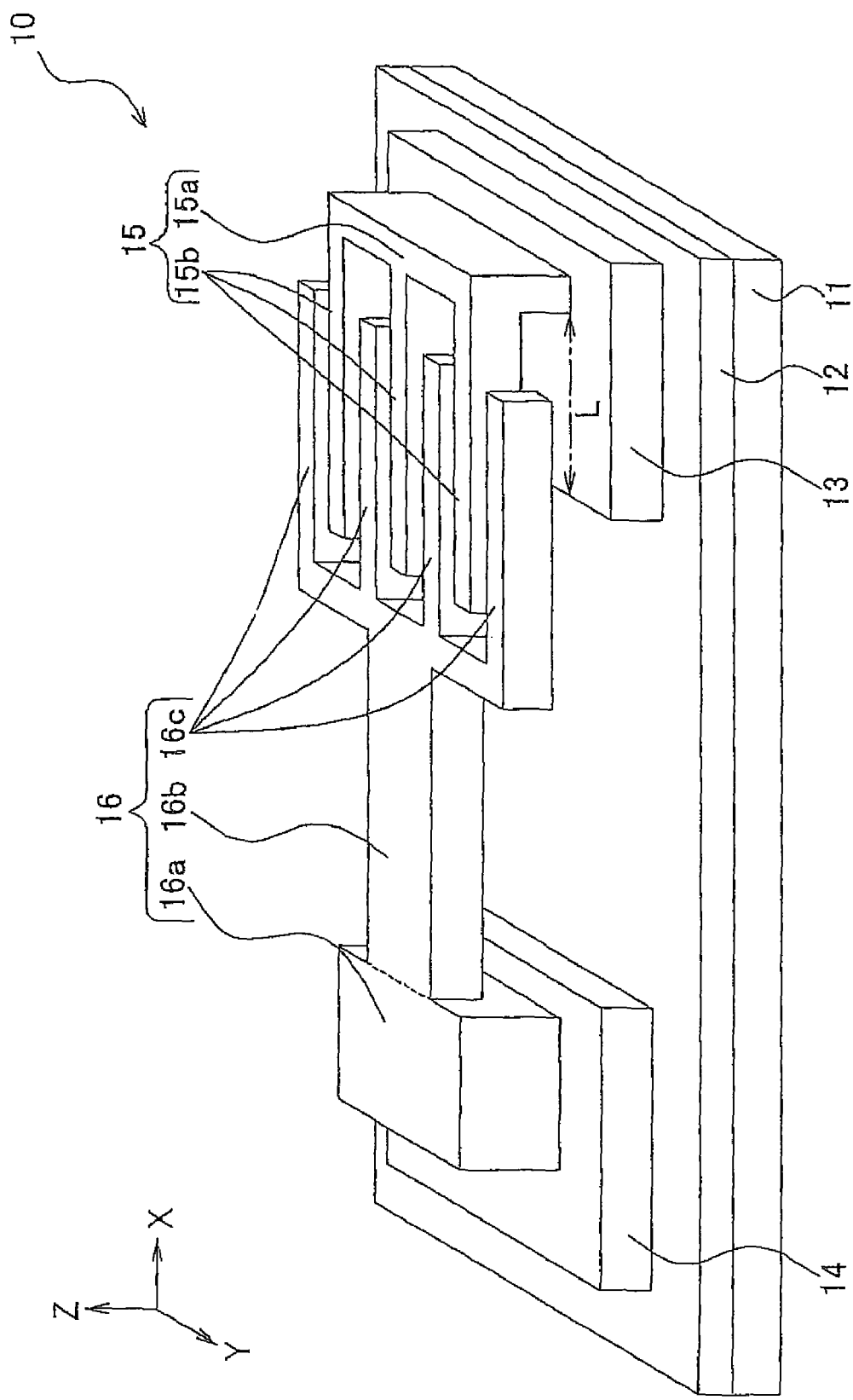
FIG. 1 is a perspective view of a resonator according to a first embodiment of the present invention.

Embodiments of the present invention will be described in detail below with reference to the accompanying drawings.

Embodiment 1

A resonator 10 according to an embodiment of the present invention will be described in detail with reference to FIGS. 1, 2A, 2B, 2C.

As shown in FIGS. 1, 2A, 2B, 2C, an SiN film 12, an insulating film, is formed on a silicon substrate 11 so as to cover the upper surface of the silicon substrate 11. Two electrodes, i.e., an output electrode 13 and an input electrode 14 are formed on the SiN film 12. For example, the main surface shape (the shape of the surface crossing a Z axis) of the output electrode 13 and the input electrode 14 is substantially rectangular (longer in a Y-axis direction than in an X-axis direction), and the two electrodes have a predetermined thickness in a Z-axis direction. A predetermined bias voltage is applied between the two electrodes. Further, a predetermined input signal is input to the input electrode 14, and a resonant frequency signal is output from the output electrode 13.

A fixed electrode (first electrode in the claims) 15 is formed on the output electrode 13. The fixed electrode 15 comprises a support portion 15a connected to the output electrode 13 and three arms 15b parallel to the silicon substrate 11 and extending from the support portion 15a toward the input electrode 14 (i.e., in the minus X-axis direction). Namely, one end of the fixed electrode 15 not directly connected to the output electrode 13 is shaped like comb teeth. Further, the main surface shape (the shape of the surface crossing the Z axis) of the support portion 15a is substantially rectangular (longer in the Y-axis direction than in the X-axis direction) and smaller than that of the output electrode 13, and its thickness is about twice that of the output electrode 13. The thickness of the arms 15b is about half that of the support portion 15a, and the arms 15b extend from the upper portion of the support portion 15a toward the input electrode 14 (i.e., in the minus X-axis direction). Thus, the arms 15b and the output electrode 13 are apart by the thickness of the output electrode 13. Moreover, the output electrode 13 further extends in the minus X-axis direction from the support portion 15a over a length L. Note that the number of the arms 15b is not limited to three but can be changed depending on the resonant frequency to be produced.

A movable electrode (second electrode in the claims) 16 is formed on the input electrode 14. The movable electrode 16 comprises a support portion 16a connected to the input electrode 14, a beam 16b parallel to the silicon substrate 11 and extending from the support portion 16a toward the output electrode 13 (i.e., in the plus X-axis direction), and four arms 16c extending from the end of the beam 16b that is opposite from the support portion 16a. The beam 16b is shaped substantially like a T in plan view, and the arms 16c extend in the plus X-axis direction from the end of the beam 16b which is the portion extending along the Y-axis direction of the T-shaped beam 16b. One end of the movable electrode 16 not directly connected to the input electrode 14 is shaped like comb teeth.

The main surface shape (the shape of the surface crossing the Z axis) of the support portion 16a is substantially rectangular (longer in the Y-axis direction than in the X-axis direction) and smaller than that of the input electrode 14, and its thickness is about twice that of the input electrode 14. The thickness of the beam 16b and the arms 16c is about half that of the support portion 16a, and the beam 16b extends from the upper portion of the support portion 16a toward the output electrode 13 (i.e., in the plus X-axis direction). Thus, the beam 16b and the arms 16c are apart from the input electrode 14 by the thickness of the input electrode 14. Note that the number of the arms 16c is not limited to four but can be changed depending on the resonant frequency to be produced.

The arms 15b of the fixed electrode 15 and the arms 16c of the movable electrode 16 are formed apart from the SiN film 12 by the same distance in the Z-axis direction. The side surfaces of the arms 15b and 16c face each other, and they are arranged such that one group of arms are sandwiched between the other group of arms. The lower surfaces of the arms 16c of the movable electrode 16 are partially opposite the output electrode 13.

Next, an example manufacturing method for the resonator 10 according to the embodiment of the present invention will be described in detail with reference to FIGS. 3A to 3H.

First, the SiN film 12, an insulating layer, is formed to be about 500 nm thick on the silicon substrate 11 according to an LP-CVD method (FIG. 3A). Then, a poly-Si layer 31 is deposited to form the output electrode 13 and the input electrode 14 according to the LP-CVD method (FIG. 3B). In the deposition of the poly-Si layer 31, $PH_3$ as an impurity gas as well as $SiH_4$, a material gas, are simultaneously introduced to dope phosphorus. By doping phosphorus, the resistance of the poly-Si layer 31 can be so reduced that the poly-Si layer 31 can be regarded as conductive.

After the formation of the poly-Si layer 31, an opening 32 is made in the poly-Si layer 31 using known photolithography and dry etching technologies to form the output electrode 13 and the input electrode 14 (FIG. 3C). After the formation of the output electrode 13 and the input electrode 14, a $SiO_2$ film 33 of about 1 μm in thickness as a sacrifice layer is formed according to the LP-CVD method (FIG. 3D). Next, openings 34, 35 are made in the $SiO_2$ film 33 by patterning using known dry etching technology to form the frames for the support portion 15a of the fixed electrode 15 and the support portion 16a of the movable electrode 16 (FIG. 3E).

Figure 2A:
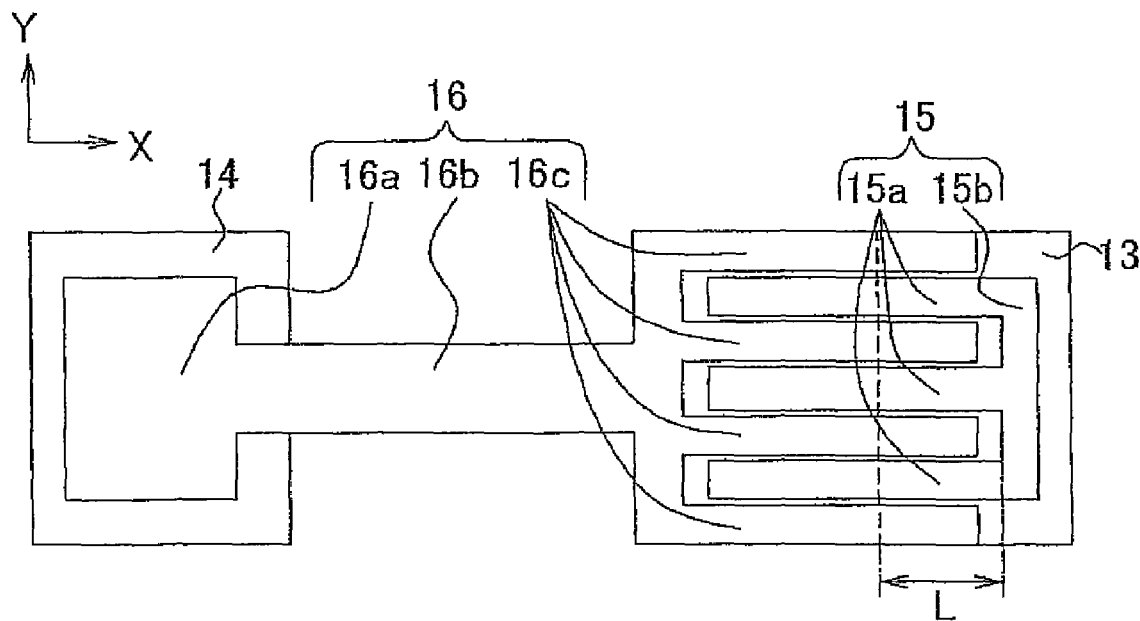
FIG. 2A is an X-Y plan view of electrodes of the resonator according to the first embodiment of the present invention.
Figure 2B:
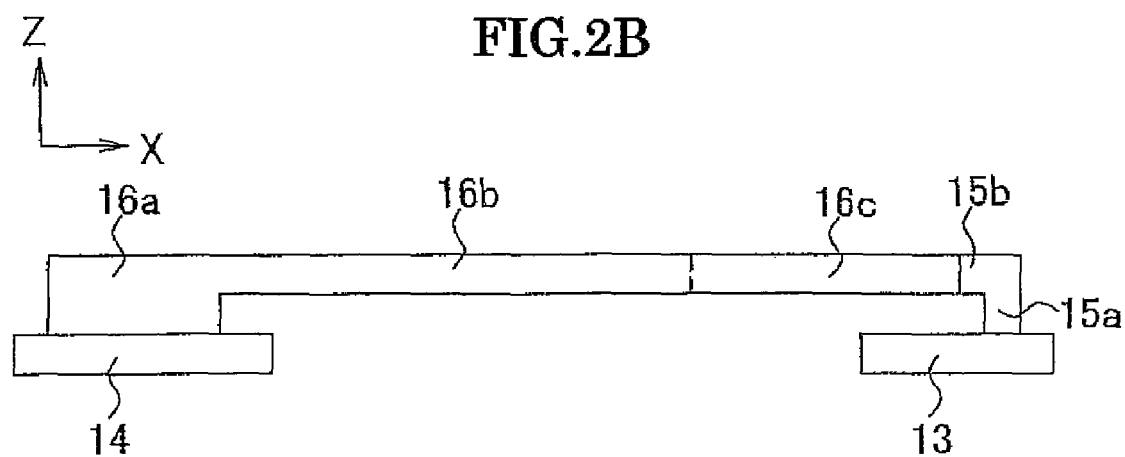
FIG. 2B is an X-Z plan view of electrodes of the resonator according to the first embodiment of the present invention.
Figure 2C:
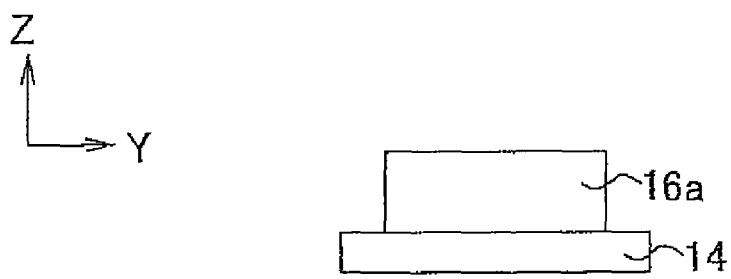
FIG. 2C is a Y-Z plan view of electrodes of the resonator according to the first embodiment of the present invention.

After the patterning of the $SiO_2$ film 33, a poly-Si layer 36 of about 1 μm in thickness is deposited according to the LP-CVD method to form the fixed electrode 15 and the movable electrode 16 (FIG. 3F). The specific depositing method is the same as for the poly-Si layer 31 as shown in FIG. 3B. After the deposition thereof, the poly-Si layer 36 is patterned into a desired shape using known dry etching technology (FIG. 3G). Thus, via this patterning, the arms 15b, the beam 16b, and the arms 16c shown in FIGS. 1, 2A are formed.

After the patterning, the $SiO_2$ film 33 is removed so that the beam 16b and the arms 16c become vibratable (FIG. 3H). Only the $SiO_2$ film is removed by wet etching using, e.g., hydrofluoric acid.

Next, change in the resonant frequency of the resonator 10 according to change in applied bias voltage will be described in detail with reference to FIGS. 4A, 4B.

When a predetermined input signal is input to the input electrode 14 with a predetermined bias voltage being applied between the output electrode 13 and the input electrode 14, in the resonator 10, the beam 16b and the arms 16c vibrate in the Z-axis direction due to electrostatic force and resilience. For example, the input electrode 14 may be connected to a reference power supply (not shown) and the output electrode 13 may be connected to ground potential. A signal of the resonant frequency due to this vibration is output from the output electrode 13.

Here the electrostatic force occurs between the output electrode 13 and the beam 16b and arms 16c, and the magnitude of the electrostatic force varies according to the area of the parts of the output electrode 13 opposite the beam 16b and the arms 16c. That is, the electrostatic force varies depending on the length in the X-axis direction of the output electrode 13. The variation in the electrostatic force is shown in FIG. 4A.

Figure 4A:
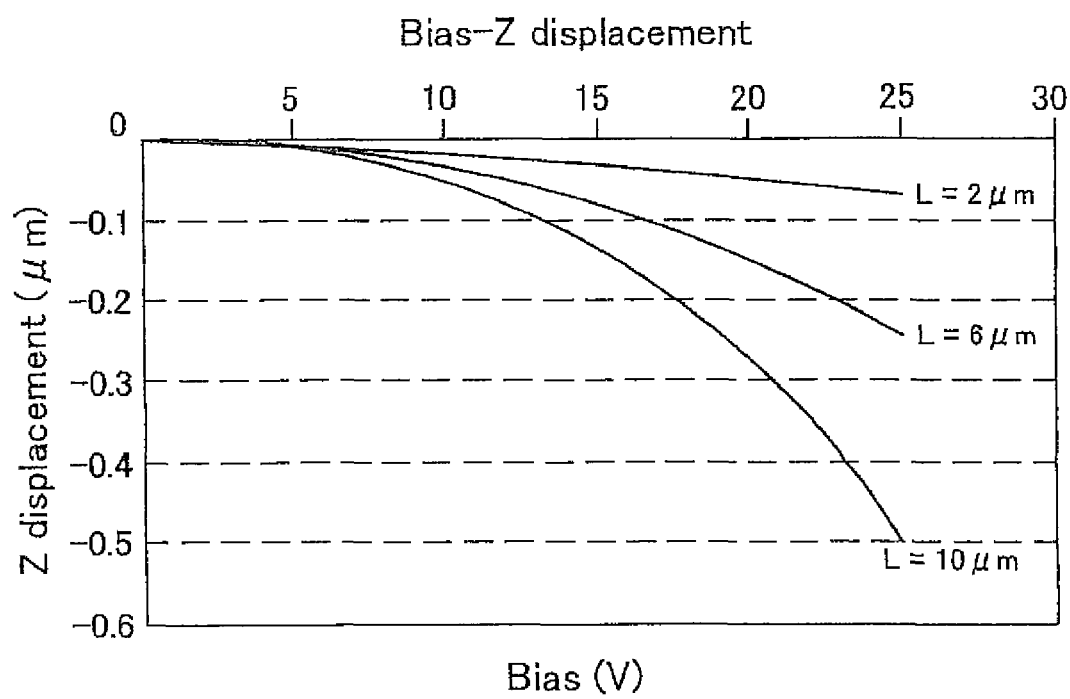
FIG. 4A is a relation graph between bias voltage and the amount of displacement in the Z-axis direction of arms of the resonator according to the first embodiment of the present invention.

In the graph of FIG. 4A, the horizontal axis represents the applied bias voltage, and the vertical axis represents the amount of displacement in the Z-axis direction of the end of the arm 16c (i.e., the end of the comb-teeth shape), and in the graph of FIG. 4A, a relation curve between the bias voltage and the amount of displacement in the Z-axis direction is shown for each value of the length L of the output electrode 13 shown in FIG. 1.

As seen from the graph of FIG. 4A, as the length L elongates in the X-axis direction, the end of the arm 16c is displaced by greater electrostatic force in the minus Z-axis direction. Also, as the bias voltage increases, the electrostatic force increases resulting in the end of the arm 16c being displaced by greater electrostatic force in the minus Z-axis direction. The arm 16c being displaced by the electrostatic force in the minus Z-axis direction results in a decrease in the distance between the output electrode 13 and the arm 16c. Also, the opposite area of the arms 15b of the fixed electrode 15 facing the arms 16c of the movable electrode 16 decreases. Thus, the value indicating the magnitude of bias voltage dependency, which is the coefficient of $V^2$ in the equation 5, varies with change in the bias voltage.

Namely, as opposed to a conventional resonator wherein the coefficient of $V^2$ that is the value indicating the magnitude of bias voltage dependency cannot be changed by changing the bias voltage, with the resonator 10, by changing the bias voltage, the opposite area of the electrodes and the distance between the electrodes, which are coefficients of the bias voltage, can be changed at the same time. For the case where by changing the bias voltage, the opposite area of the electrodes and the distance between the electrodes change, changes in the resonant frequency are shown in FIG. 4B.

Figure 4B:
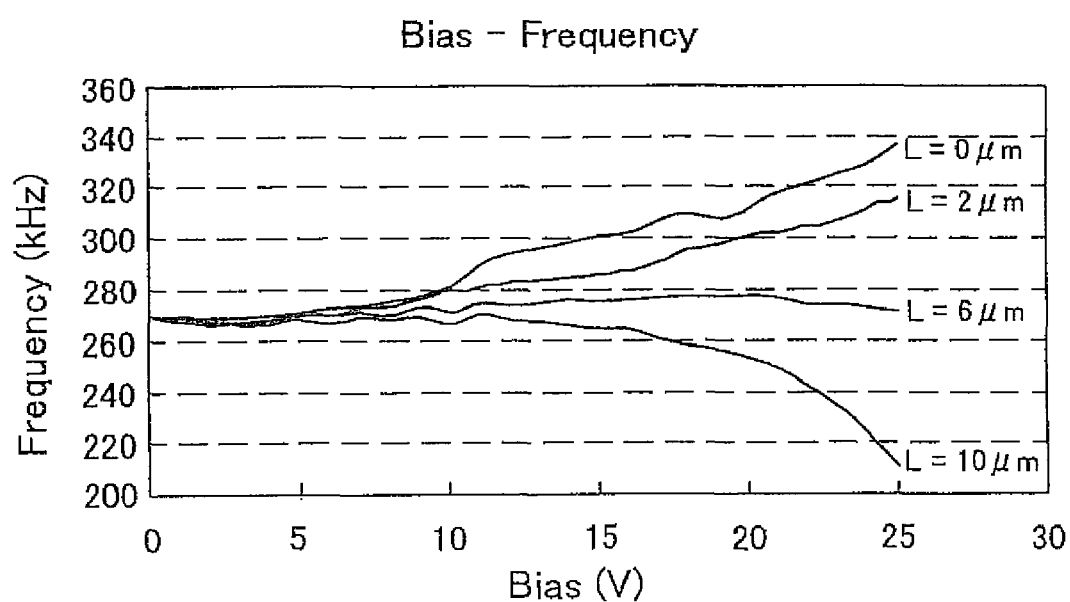
FIG. 4B is a relation graph between bias voltage and the resonant frequency of the resonator according to the first embodiment of the present invention.

In the graph of FIG. 4B, the horizontal axis represents the applied bias voltage, and the vertical axis represents the resonant frequency produced from the output electrode 13, and in the graph of FIG. 4B, a relation curve between the bias voltage and the resonant frequency is shown for each value of the length L elongated in the X-axis direction of the output electrode 13 shown in FIG. 1.

As seen from the graph of FIG. 4A, by increasing the length L of the output electrode 13, change in the resonant frequency due to change in the bias voltage can be controlled. For example, the change in resonant frequency for when the bias voltage changes from 24 V to 25 V can be set to be about 8 kHz when the length L is 0 μm, about 4 kHz when the length L is 2 Mm, about −1 kHz when the length L is 6 μm, and about −12 kHz when the length L is 10 μm. Further, by setting the length L to 6 μm, change in the resonant frequency due to change in the bias voltage becomes small, and thus, the resonator 10 can be used in apparatuses which need such a resonant frequency that is small in variation.

As such, because the output electrode 13 is formed as an extension of the fixed electrode 15, the resonator according to the present embodiment can alleviate restrictions in usage and design due to the bias voltage dependency so that usage and design conditions can be easily determined.

Embodiment 2

An embodiment is the same in configuration as the embodiment 1 except the output electrode, wherein the output electrode is formed of a collection of multiple electrodes so as to enable change in the length in the Z-axis direction of the output electrode and wherein each of the multiple electrodes is connected to switch means. A resonator 50 of this configuration will be described in detail with reference to FIGS. 5, 6. The same reference numerals are used to denote the same or like parts as in the embodiment 1 with description thereof being omitted.

Figure 5:
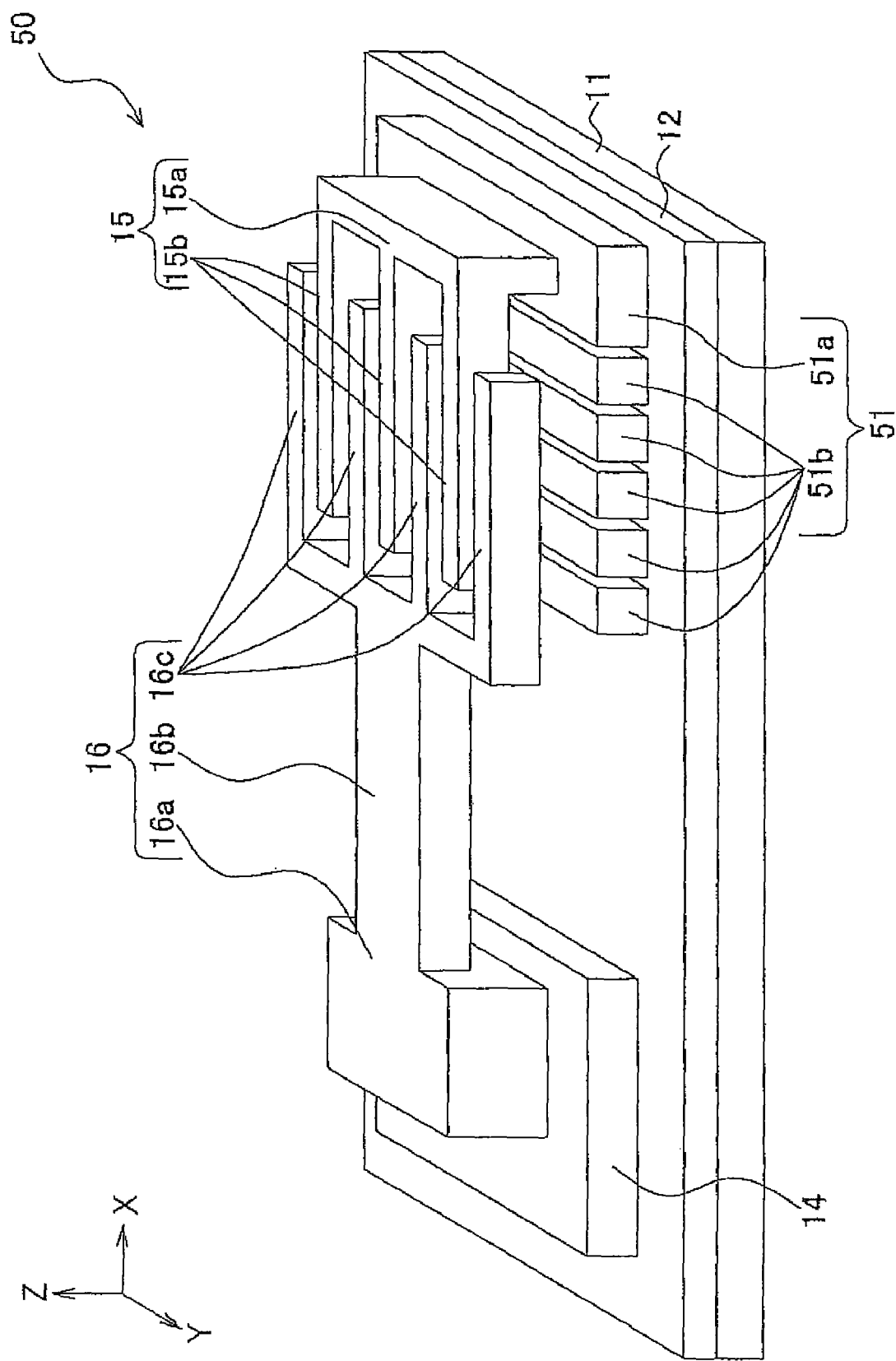
FIG. 5 is a perspective view of a resonator according to a second embodiment of the present invention.
Figure 6:
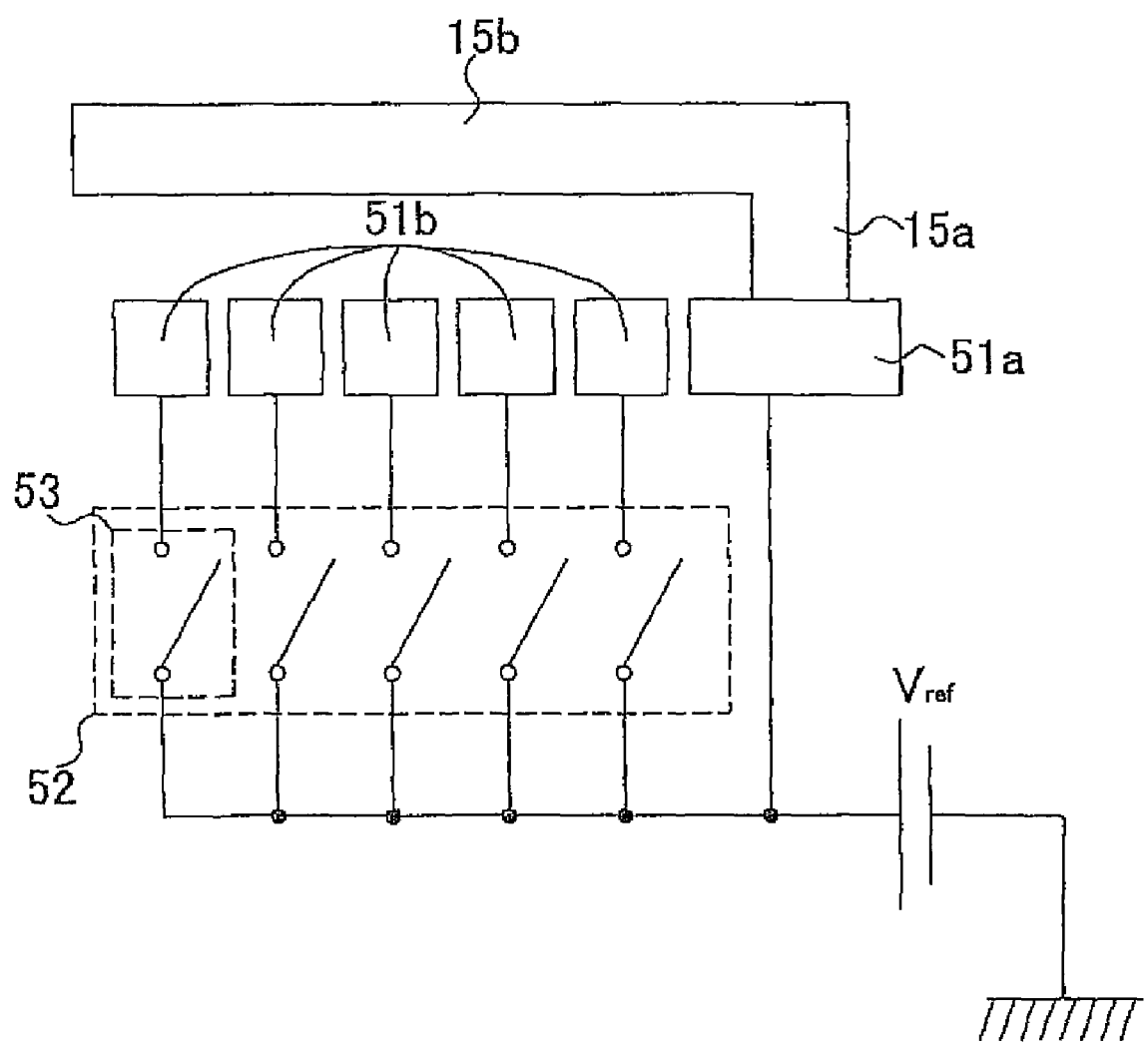
FIG. 6 is a configuration diagram of output and fixed electrodes of the resonator according to the second embodiment of the present invention.

As shown in FIGS. 5, 6, an output electrode 51 comprises an electrode 51a connected to the support portion 15a of the fixed electrode 15 and five electrodes 51b connected to a switch group 52. Each of the electrodes 51b is connected to one end of a switch 53, and the other end of the switch 53 from the electrode 51b is connected to a reference voltage Vref. The electrode 51a is connected to the reference voltage Vref, not via a switch 53. Hence, the same voltage is applied to the electrode 51b connected to a switch 53 which is ON as to the electrode 51a. Meanwhile, the electrode 51b connected to a switch 53 which is OFF is at ground potential.

With use of the above configuration of the output electrode 51, the magnitude of electrostatic force to displace the arms 16c of the movable electrode 16 in the Z-axis direction can be adjusted. Namely, if all the switches 53 connected to the electrodes 51b are ON, the area of the output electrode 51 is maximal, and hence, the displacement of the arms 16c of the movable electrode 16 in the Z-axis direction is maximal. On the other hand, if all the switches 53 are OFF, the displacement of the arms 16c of the movable electrode 16 in the Z-axis direction is minimal. By switching on/off the switches 53, the distance between the arms 16c of the movable electrode and the output electrode 51 can be adjusted.

Since the output electrode 51 is connected to the reference voltage Vref, a bias voltage is applied between the input and output. Thus, the input electrode 14 may be connected to ground potential. The number of the electrodes 51b is not limited to the above number but may be changed according to the area adjustment of the input electrode 14. Further, the switch 53 may be a MOS switch, a transistor switch, or the like not being limited to one shown in FIG. 6.

Next, an example manufacturing method for the resonator 50 according to the embodiment 2 of the present invention will be described in detail with reference to FIGS. 7, 8.

Figure 7A:
FIGS. 7A to 7K are sectional views of the resonator according to the second embodiment of the present invention for respective manufacturing processes.
Figure 7B:
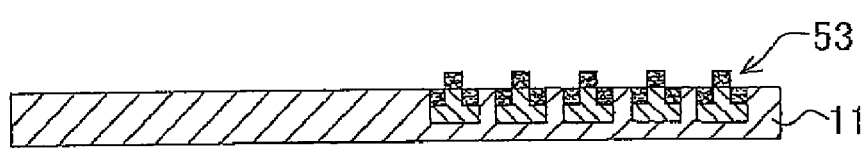
Figure 7C:
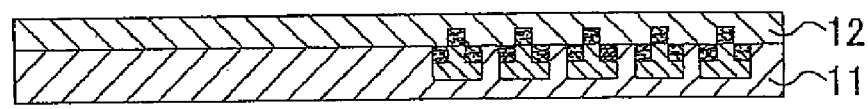
Figure 7D:
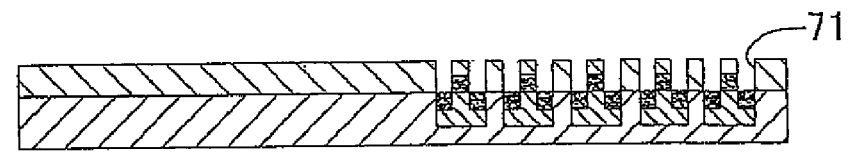
Figure 8:
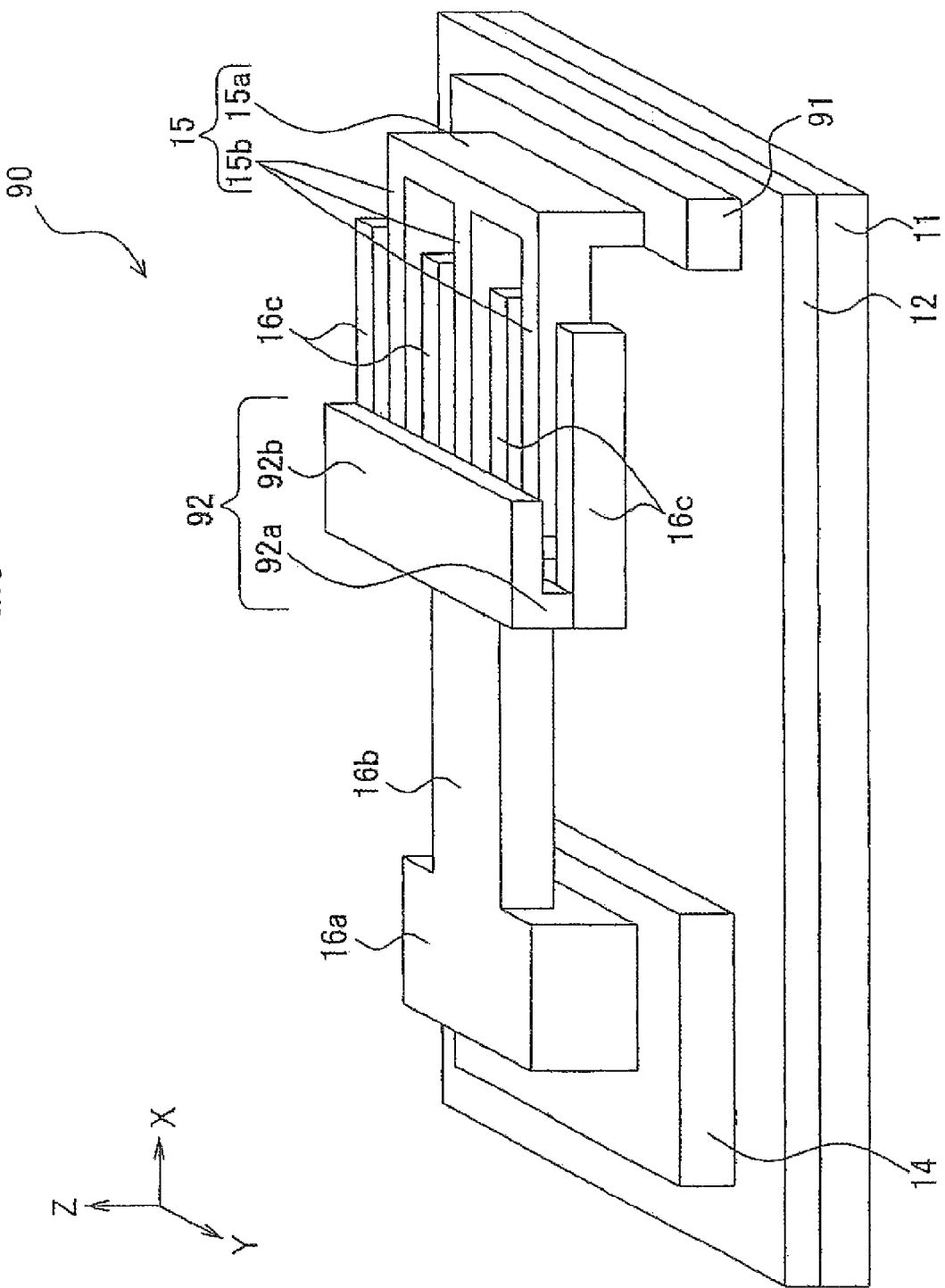
FIG. 8 is a perspective view of a resonator according to a third embodiment of the present invention.

First, a silicon substrate 11 is prepared (FIG. 7A) The switches 53 are formed on the silicon substrate 11 (FIG. 7B). A SiN film 12, an insulating layer, is formed to cover the top of the silicon substrate 11 and switches 53 and to be about 500 nm thick according to the LP-CVD method (FIG. 7C). After the formation of the SiN film 12, openings 71 are made using known dry etching technology to expose the terminals of the switches 53 (FIG. 7D).

Figure 7E:
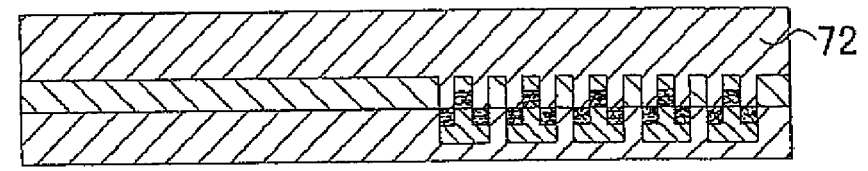

Then, a poly-Si layer 72 is deposited to form the output electrode 51 and the input electrode 14 according to the LP-CVD method (FIG. 7E). Since the poly-Si layer 72 is deposited inside the openings 71 as well, the terminals of the switches 53 and the electrodes 51b are conductively joined.

Figure 7F:
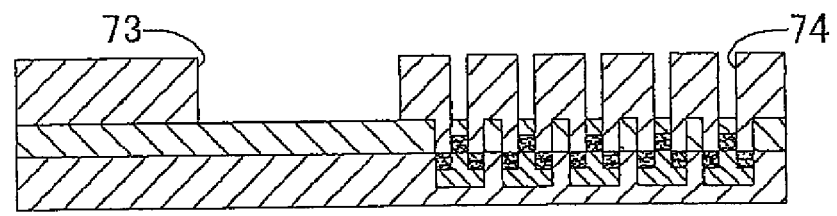

After the formation of the poly-Si layer 72, openings 73 and 74 are made in the poly-Si layer 72 using known photo-lithography and dry etching technologies (FIG. 7F). The output electrode 51 and the input electrode 14 are formed by the opening 73 separating them, and the electrodes 51a and 51b are formed by the openings 74 dividing the output electrode 51.

Figure 7G:
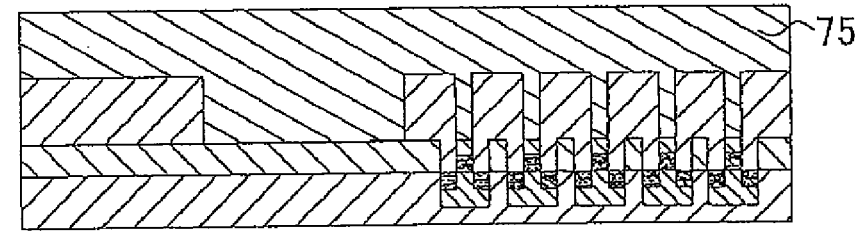
Figure 7H:
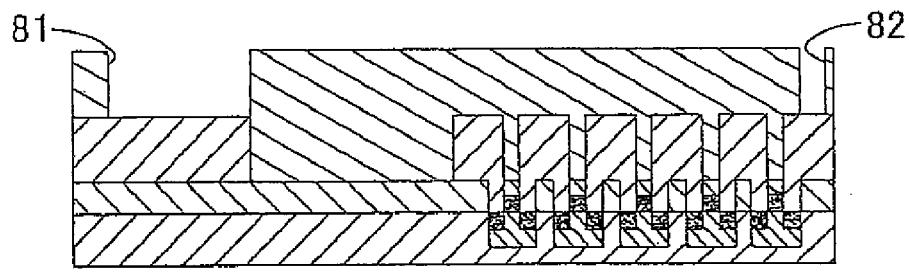

After the formation of the output electrode 51 and the input electrode 14, a SiO$_2$ film 75 of about 1 µm in thickness as a sacrifice layer is formed according to the LP-CVD method (FIG. 7G). Next, openings 81, 82 are made in the SiO$_2$ film 75 by patterning using known dry etching technology to form the frames for the support portion 15a of the fixed electrode 15 and the support portion 16a of the movable electrode 16 (FIG. 7H).

Figure 7I:
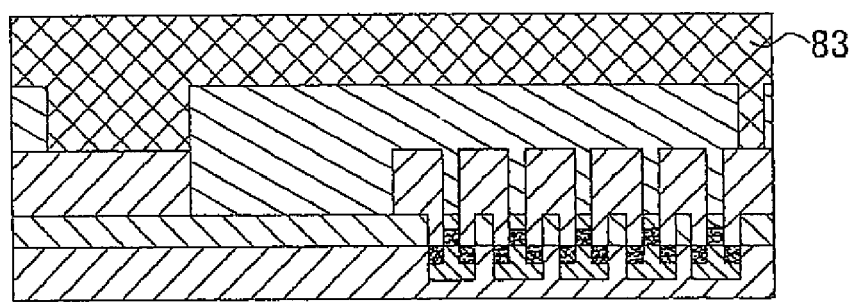
Figure 7J:
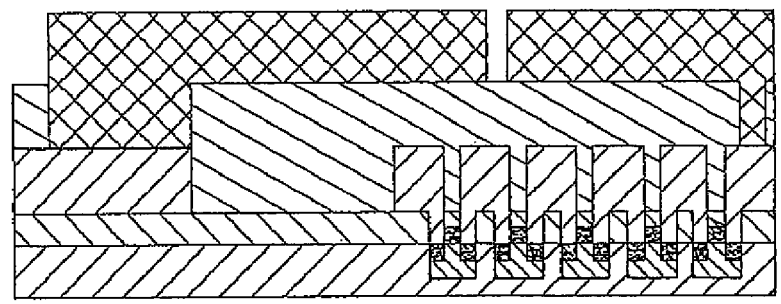

After the patterning of the SiO$_2$ film 75, a poly-Si layer 83 of about 1 µm in thickness is deposited according to the LP-CVD method to form the fixed electrode 15 and the movable electrode 16 (FIG. 7I). After the deposition thereof, the poly-Si layer 83 is patterned into a desired shape using known dry etching technology (FIG. 7J). Thus, via this patterning, the arms 15b, the beam 16b, and the arms 16c shown in FIG. 5 are formed.

Figure 7K:
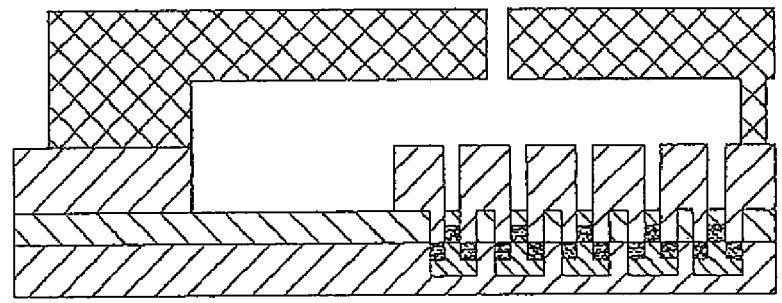

After the patterning, the SiO$_2$ film 75 is removed so that the beam 16b and the arms 16c become vibratable (FIG. 7K). Only the SiO$_2$ film is removed by wet etching using, e.g., hydrofluoric acid.

In the embodiment 2, by operating the switch group 52, the area of the output electrode 51 is changed, thereby adjusting the displacement of the arms 16c of the movable electrode 16 in the Z-axis direction, and thus the resonant frequency can be adjusted. Moreover, according to the embodiment 2, because the area of the output electrode 51 can be changed even after the manufacture of the resonator 50, a signal of an optimum resonant frequency can always be output regardless of the bias voltage.

Embodiment 3

An embodiment is the same in configuration as the embodiment 1 except the output electrode and the movable electrode, wherein the electrode portion extending in the minus X-axis direction from the portion connected to the support portion of the output electrode at the lower side is removed and wherein a parallel plate electrode is provided to cover partially the top of the arms of the movable electrode. A resonator 90 having this configuration will be described in detail with reference to FIGS. 8, 9A, 9B, 9C. The same reference numerals are used to denote the same or like parts as in the embodiment 1 with description thereof being omitted.

As shown in FIGS. 8, 9A, 9B, 9C, an output electrode 91 has no portion extending toward the input electrode 14 (i.e., in the minus X-axis direction) from the portion connected to the support portion 15a at the lower side. Hence, electrostatic force from the output electrode 91 to displace the arms 16c in the Z-axis direction is very small.

Furthermore, a parallel plate electrode 92 is formed on the top of the portion extending along the Y-axis direction of the beam 16b (i.e., its end connected to the arms 16c). The parallel plate electrode 92 comprises a plate support portion 92a connected to the beam 16b and a vibrating portion 92b extending parallel to the arms 16c from the plate support portion 92a. The thickness in the Z-axis direction of the parallel plate electrode 92 is about twice that of the arms 16c. Further, the vibrating portion 92b extends from the upper portion of the plate support portion 92a in the X-axis direction, and thus the arms 15b and the arms 16c are apart from the vibrating portion 92b by a distance equal to the thickness in the Z-axis direction of the vibrating portion 92b. Thus, the vibrating portion 92b is supported to be vibratable in a direction parallel to the opposite surfaces of both the arms (i.e., in the Z-axis direction).

When a predetermined bias voltage is applied between the input and output electrodes, a potential difference occurs between the parallel plate electrode 92 and the fixed electrode 15, and hence the vibrating portion 92b is displaced in the Z-axis direction by electrostatic force. Thus, the distance between the electrodes (i.e., the distance between the arms 15b and the vibrating portion 92b) in the equation 5 changes even if the arms 16c is not displaced in the Z-axis direction, and hence the magnitude of bias voltage dependency can be changed as in the embodiment 1.

Next, an example manufacturing method for the resonator 90 according to the embodiment 3 of the present invention will be described in detail with reference to FIGS. 10A to 10F.

The processes shown in FIGS. 3A to 3G of the manufacturing method of the embodiment 1 apply to the manufacturing method of the present embodiment, and hence description thereof is omitted. Because the output electrode 91 is different in size from that of the embodiment 1, the patterning of the poly-Si layer 31 for the formation of the input and output electrodes in the present embodiment is different from the patterning shown in FIG. 3C. Specifically, the patterning of the poly-Si layer 31 is performed such that one ends of the output electrode 91 and the support portion 15a are level with each other in the X-axis direction.

Figure 10A:
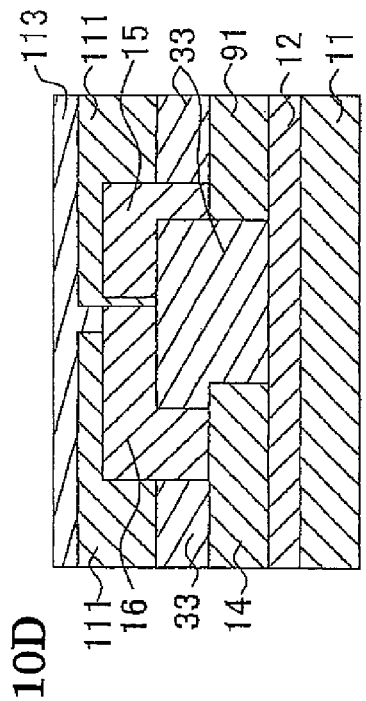
FIGS. 10A to 10F are sectional views of the resonator according to the third embodiment of the present invention for respective manufacturing processes.
Figure 10B:
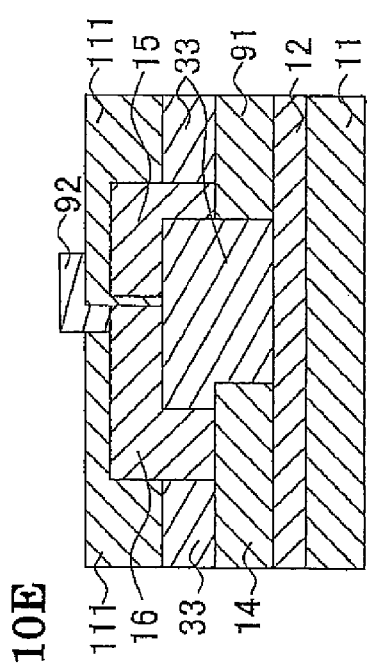
Figure 10C:
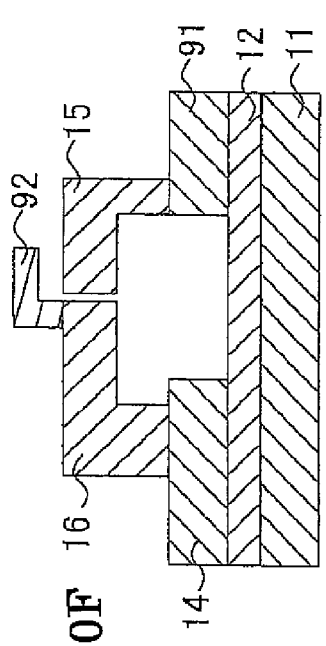
Figure 10D:
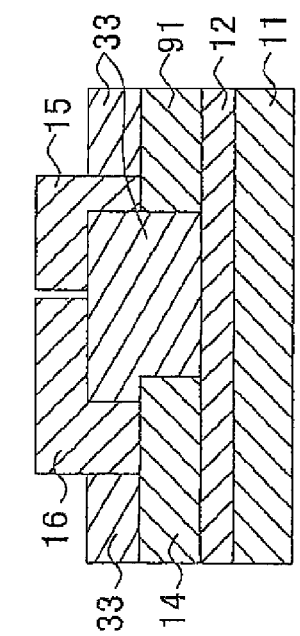

After the patterning of the arms 15b and the arms 16c, a SiO$_2$ film 111 of about 1 μm in thickness as a sacrifice layer is formed according to the LP-CVD method (FIG. 10B). Next, an opening 112 is made in the SiO$_2$ film 111 by patterning using known dry etching technology to form the frame for the plate support portion 92a of the parallel plate electrode 92 (FIG. 10C). After the formation of the opening 112, a poly-Si layer 113 is deposited according to the LP-CVD method to form the parallel plate electrode 92 (FIG. 10D).

Figure 9A:
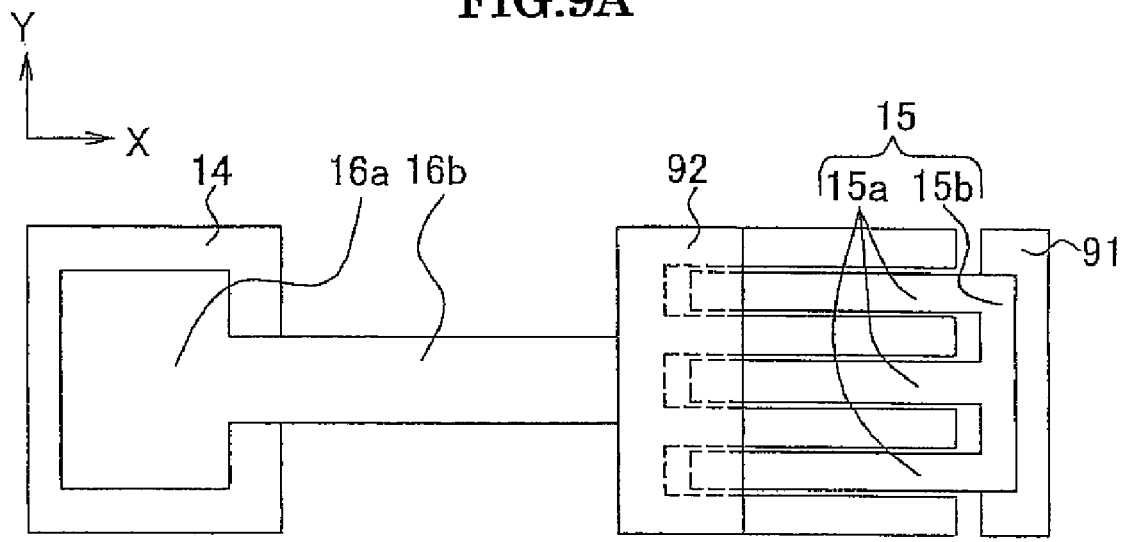
FIG. 9A is an X-Y plan view of electrodes of the resonator according to the third embodiment of the present invention.
Figure 9B:
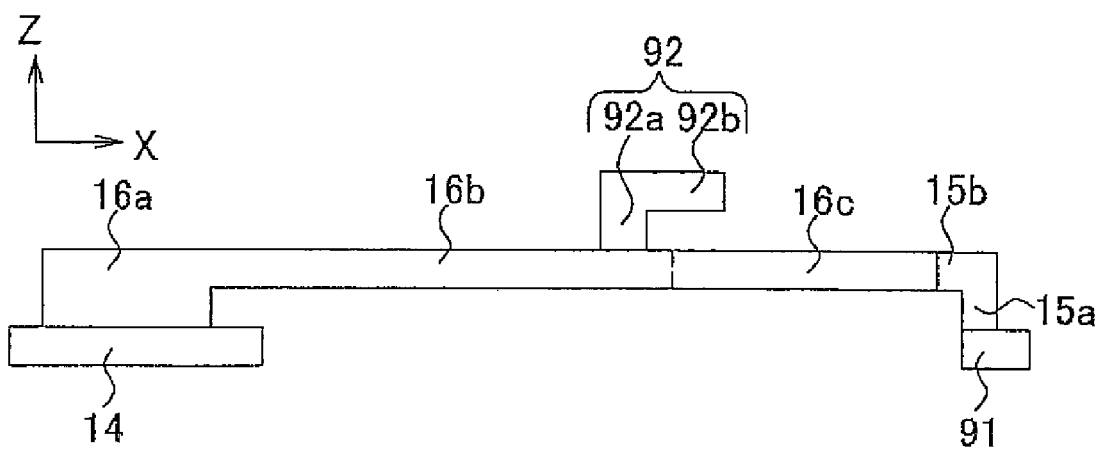
FIG. 9B is an X-Z plan view of electrodes of the resonator according to the third embodiment of the present invention.
Figure 9C:
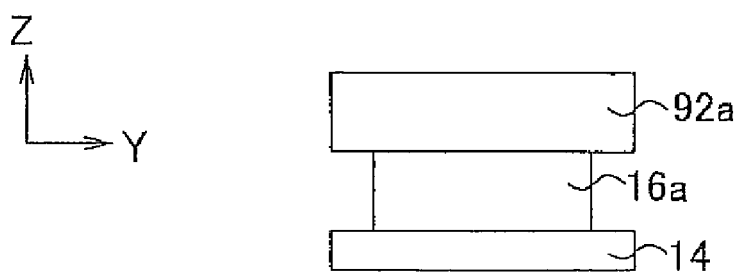
FIG. 9C is a Y-Z plan view of electrodes of the resonator according to the third embodiment of the present invention.
Figure 10E:
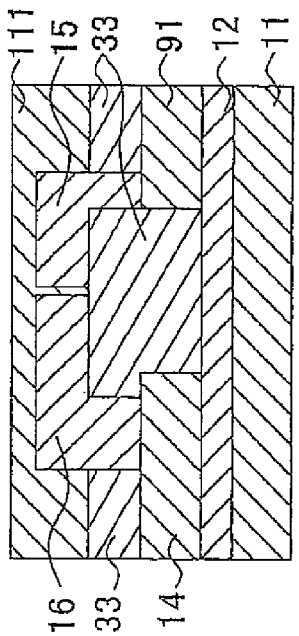
Figure 10F:
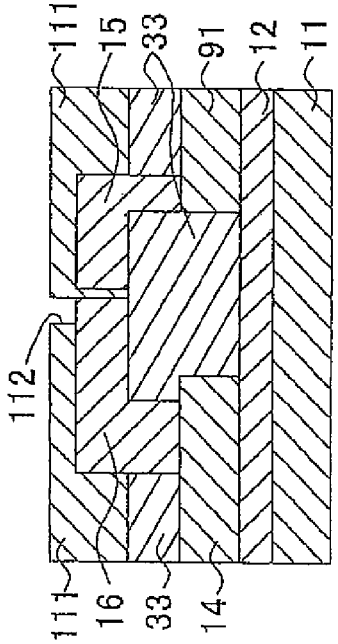

After the deposition thereof, the poly-Si layer 113 is patterned into a desired shape using known dry etching technology (FIG. 10E). That is, via the patterning, the vibrating portion 92b shown in FIGS. 8, 9A, 9B is formed. After this patterning, the SiO$_2$ films 33, 111 are removed so that the beam 16b, the arms 16c, and the plate support portion 92a become vibratable (FIG. 10F). Only the SiO$_2$ films are removed by wet etching using, e.g., hydrofluoric acid.

Figure 11:
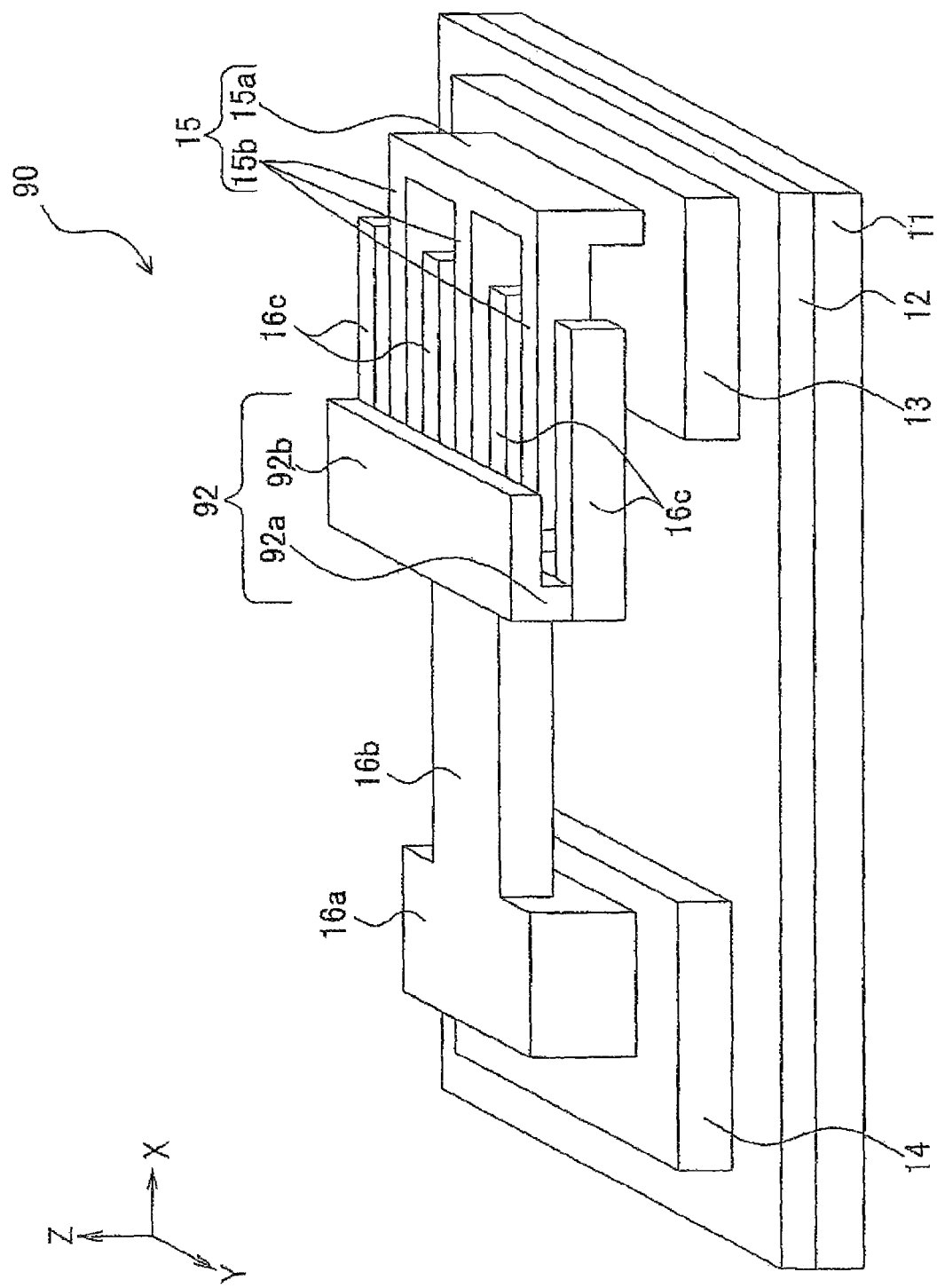
FIG. 11 is a perspective view of a variant of the resonator according to the third embodiment of the present invention.

Moreover, as shown in FIG. 11, an output electrode 13 as in the embodiment 1 may be used instead of the output electrode 91. By this means, the area of the output electrode is enlarged, and thus the arms 16c can be displaced in the Z-axis direction by electrostatic force. Therefore, changes in the coefficient of V$^2$ indicating the magnitude of bias voltage dependency in the equation 5 can be made larger.

Figure 12:
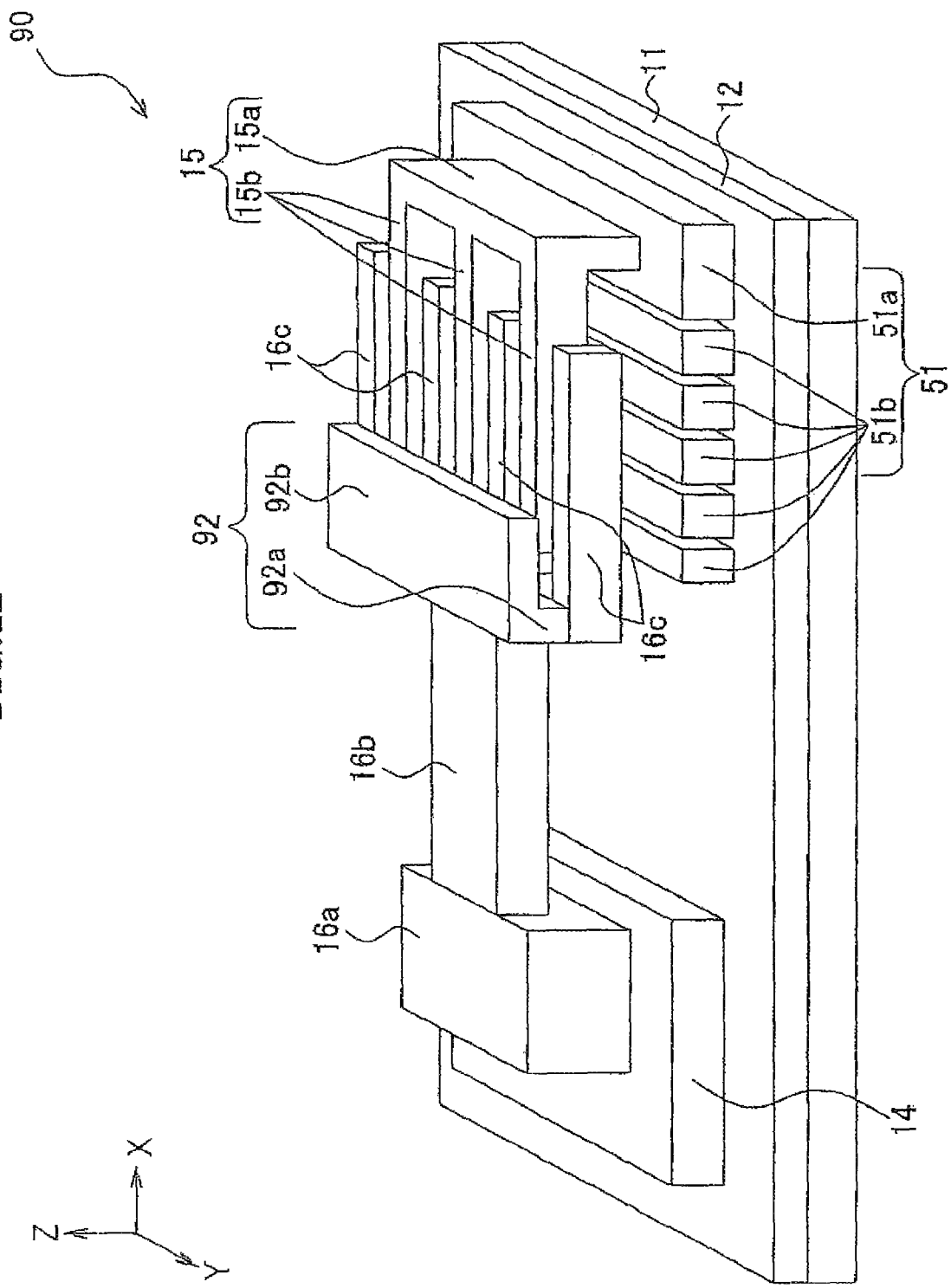
FIG. 12 is a perspective view of a variant of the resonator according to the third embodiment of the present invention.

Furthermore, as shown in FIG. 12, an output electrode 51 as in the embodiment 2 may be used instead of the output electrode 91. By this means, the area of the output electrode becomes adjustable even after the manufacture, and thus with the displacement in the Z-axis direction by electrostatic force from the arms 16c being adjusted freely, changes in the coefficient of V$^2$ indicating the magnitude of bias voltage dependency in the equation 5 can be made larger.

This application is based on Japanese Patent Application No. 2008-008972 which is incorporated herein by reference.

What is claimed is:

1. A resonator comprising:
    a first electrode that has a first support portion and an arm extending horizontally from said first support portion;
    a second electrode that has a second support portion and an arm extending horizontally toward said first electrode from said second support portion, wherein said arm of said first electrode and said arm of said second electrode are placed in parallel apart from each other; and
    an output electrode placed underneath said arm of said first electrode and said arm of said second electrode and electrically connected to said first support portion of said first electrode,
    wherein said second electrode further has a beam extending horizontally from said second support portion, and said arm of said second electrode is connected to said second support portion via said beam.

2. A resonator comprising:
    a first electrode that has a first support portion and an arm extending horizontally from said first support portion;
    a second electrode that has a second support portion and an arm extending horizontally toward said first electrode from said second support portion, wherein said arm of said first electrode and said arm of said second electrode are placed in parallel apart from each other; and
    an output electrode placed underneath said arm of said first electrode and said arm of said second electrode and electrically connected to said first support portion of said first electrode,
    wherein said output electrode is formed of a plurality of independent electrodes, only one of said plurality of independent electrodes is electrically connected to said first support portion, and voltages are selectively applied individually to other ones of said plurality of independent electrodes.

3. A resonator comprising:
    a first electrode that has a first support portion and an arm extending horizontally from said first support portion;
    a second electrode that has a second support portion and an arm extending horizontally toward said first electrode from said second support portion, wherein said arm of said first electrode and said arm of said second electrode are placed in parallel apart from each other;
    an output electrode placed underneath said arm of said first electrode and said arm of said second electrode and electrically connected to said first support portion of said first electrode; and
    a parallel plate electrode placed above said arm of said second electrode and connected to said arm of said second electrode.

* * * * *